(12) United States Patent
Wang et al.

(10) Patent No.: US 11,282,867 B2
(45) Date of Patent: Mar. 22, 2022

(54) MANUFACTURING METHOD OF DISPLAY SUBSTRATE MOTHERBOARD, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Rong Wang, Beijing (CN); Xiaoqing Shu, Beijing (CN); Bo Zhang, Beijing (CN); Yunsheng Xiao, Beijing (CN); Xiangdan Dong, Beijing (CN); Rui Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/966,787

(22) PCT Filed: Oct. 10, 2019

(86) PCT No.: PCT/CN2019/110400
§ 371 (c)(1),
(2) Date: Jul. 31, 2020

(87) PCT Pub. No.: WO2021/068165
PCT Pub. Date: Apr. 15, 2021

(65) Prior Publication Data
US 2021/0143185 A1 May 13, 2021

(51) Int. Cl.
*H01L 51/56* (2006.01)
*H01L 27/12* (2006.01)
(Continued)

(52) U.S. Cl.
CPC ............ *H01L 27/124* (2013.01); *G06F 1/184* (2013.01); *G06F 3/044* (2013.01);
(Continued)

(58) Field of Classification Search
CPC ............... H01L 27/124; H01L 27/1262; H01L 51/0097; H01L 27/04103; G06F 1/184;
(Continued)

(56) References Cited

U.S. PATENT DOCUMENTS

2014/0093711 A1* 4/2014 Paulson ................ C03C 17/001
428/217
2015/0034935 A1 2/2015 Choi
(Continued)

FOREIGN PATENT DOCUMENTS

| CN | 104377223 A | 2/2015 |
| CN | 106992263 A | 7/2017 |

(Continued)

*Primary Examiner* — Abdul-Samad A Adediran
(74) *Attorney, Agent, or Firm* — Muncy, Geissler, Olds & Lowe, P C.

(57) ABSTRACT

The present disclosure provides a display substrate motherboard and a manufacturing method thereof, and a display device, wherein the display substrate motherboard includes a plurality of display units located on an organic substrate and a cutting region between adjacent display units, and the cutting region includes therein the organic substrate and an inorganic film layer covering the organic substrate.

19 Claims, 4 Drawing Sheets

(51) Int. Cl.
*G06F 1/18* (2006.01)
*G06F 3/044* (2006.01)
*H01L 51/00* (2006.01)

(52) U.S. Cl.
CPC ...... *H01L 27/1262* (2013.01); *H01L 51/0097* (2013.01); *G06F 2203/04103* (2013.01)

(58) Field of Classification Search
CPC ........... G06F 3/044; G06F 2203/04103; C03C 17/001
USPC ........................................................ 428/217
See application file for complete search history.

(56) References Cited

U.S. PATENT DOCUMENTS

| | | |
|---|---|---|
| 2015/0048329 A1 | 2/2015 | Kim |
| 2019/0157626 A1* | 5/2019 | Wang ................. H01L 51/0097 |

FOREIGN PATENT DOCUMENTS

| | | |
|---|---|---|
| CN | 107919364 A | 4/2018 |
| CN | 108807480 A | 11/2018 |

* cited by examiner

MANUFACTURING METHOD OF DISPLAY SUBSTRATE MOTHERBOARD, AND DISPLAY DEVICE

CROSS-REFERENCE TO RELATED APPLICATION

This application is the U.S. national phase of PCT Application No. PCT/CN2019/110400 filed on Oct. 10, 2019, the disclosure of which is incorporated in its entirety by reference herein.

TECHNICAL FIELD

The present disclosure relates to the field of display technology, and in particular to a manufacturing method of a display substrate motherboard and a display device.

BACKGROUND

Compared with traditional liquid crystal display (LCD), Organic Light-Emitting Diode (OLED) has the advantages of self-luminescence, wide color gamut, high contrast, lightness and thinness, which makes OLED widely used in new smart wearable devices.

It is necessary to obtain a display substrate by cutting a display substrate motherboard. However, in the related art, the effect of cutting the display substrate motherboard is not satisfactory, and the yield of the display substrate after cutting is not high.

SUMMARY

The embodiments of the present disclosure provide a manufacturing method of a display substrate motherboard and a display device.

In a first aspect, an embodiment of the present disclosure provides a manufacturing method of a display substrate motherboard including a plurality of display units located on an organic substrate and a cutting region between adjacent display units, the cutting region including therein the organic substrate and an inorganic film layer covering the organic substrate.

Further, a total thickness of the inorganic film layer in the cutting region ranges from 200 to 400 nm.

Further, the display substrate motherboard further includes a bezel region located between the display unit and the cutting region, an inorganic film layer in the bezel region includes a blocking layer located on the organic substrate, the inorganic film layer in the cutting region includes part of the blocking layer located on the organic substrate.

Further, a thickness of the part of the blocking layer in the cutting region is less than a thickness of the blocking layer in the bezel region.

Further, the thickness of the part of the blocking layer in the cutting region ranges from 200 to 400 nm.

Further, the blocking layer has a step structure at a boundary between the cutting region and the bezel region.

Further, the inorganic film layer in the bezel region further includes a buffer layer, a first inorganic film layer in a thin film transistor array layer, and a protection layer located on the blocking layer sequentially.

Further, a total thickness of the inorganic film layer in the bezel region ranges from 1700 to 2100 nm, and a thickness of the part of the blocking layer in the cutting region ranges from 200 to 400 nm.

Further, an orthographic projection region of the first inorganic film layer in the bezel region on the organic substrate is located within an orthographic projection region of the buffer layer in the bezel region on the organic substrate.

Further, an orthographic projection region of the protection layer in the bezel region on the organic substrate is located within an orthographic projection region of the first inorganic film layer in the bezel region on the organic substrate.

Further, the inorganic film layer in the bezel region further includes a buffer layer, a first inorganic film layer in a thin film transistor array layer, a protection layer and a second inorganic film layer in a touch structure located on the blocking layer sequentially.

Further, a total thickness of the inorganic film layer in the bezel region ranges from 2230 to 2630, and a thickness of the part of the blocking layer in the cutting region ranges from 200 to 400 nm.

Further, an orthographic projection region of the second inorganic film layer in the bezel region on the organic substrate is located within an orthographic projection region of the protection layer in the bezel region on the organic substrate.

Further, the organic substrate includes a first organic layer, a second organic layer, and an inorganic material layer located between the first organic layer and the second organic layer, the second organic layer is located between the plurality of display units and the first organic layer.

Further, the organic substrate is a flexible base substrate.

In a second aspect, an embodiment of the present disclosure further provides a manufacturing method of a display substrate motherboard including:

forming a plurality of functional film layers on an organic substrate sequentially, wherein, forming an inorganic film layer among the plurality of functional film layers includes: removing at least part of a thickness of the inorganic film layer in a cutting region of the display substrate motherboard using an etching process, so that a total thickness of the inorganic film layer in the cutting region of the display substrate motherboard after a light emitting element and an encapsulation layer are formed ranges from 200 to 400 nm.

Further, the step of forming the plurality of functional film layers on the organic substrate sequentially includes:

forming a blocking layer on the organic substrate;

removing at least part of a thickness of the blocking layer in the cutting region using an etching process.

Further, the step of forming the plurality of functional film layers on the organic substrate sequentially includes:

after at least two inorganic film layers are formed on the organic substrate, removing at least part of thicknesses of the at least two inorganic film layers in the cutting region using an etching process.

Further, the step of forming the plurality of functional film layers on the organic substrate sequentially includes:

forming a blocking layer, a buffer layer and a thin film transistor array layer on the organic substrate sequentially;

removing a first inorganic film layer of the thin film transistor array layer and part of the buffer layer in the cutting region by a first etching;

removing the remaining buffer layer and part of the blocking layer in the cutting region by a second etching;

forming a protection layer on a side of the thin film transistor array layer facing away from the organic substrate, and removing the protection layer in the cutting region by a third etching so that a thickness of the remaining blocking layer in the cutting region of the display substrate motherboard ranges from 200 to 400 nm.

Further, the step of forming the plurality of functional film layers on the organic substrate sequentially includes:

forming a blocking layer, a buffer layer and a thin film transistor array layer on the organic substrate sequentially;

removing a first inorganic film layer of the thin film transistor array layer and part of the buffer layer in the cutting region by a first etching;

forming a protection layer on a side of the thin film transistor array layer facing away from the organic substrate, and removing the protection layer in the cutting region by a second etching;

forming a touch structure on a side of the protection layer facing away from the organic substrate, and removing a second inorganic film layer of the touch structure, the remaining buffer layer and part of the blocking layer in the cutting region, so that a thickness of the remaining blocking layer in the cutting region of the display substrate motherboard ranges from 200 to 400 nm.

In a third aspect, an embodiment of the present disclosure further provides a display device including the display substrate formed by cutting the above display substrate motherboard.

DETAILED DESCRIPTION

Hereinafter, the technical solutions in the embodiments of the present disclosure will be described clearly and thoroughly in conjunction with the drawings in the embodiments of the present disclosure. Obviously, the described embodiments are part of the embodiments of the present disclosure, but not all of the embodiments. Based on the embodiments in the present disclosure, all other embodiments obtained by a person of ordinary skill in the art without creative efforts should fall within the protection scope of the present disclosure.

In the related art, the effect of cutting the display substrate motherboard is not satisfactory, and the yield of the display substrate after cutting is not high.

In view of the above problem, the embodiments of the present disclosure provide a manufacturing method of a display substrate motherboard and a display device, which can solve the problem in the related art that the effect of cutting the display substrate motherboard is not satisfactory and the yield of the display substrate after cutting is not high.

Figure 1:
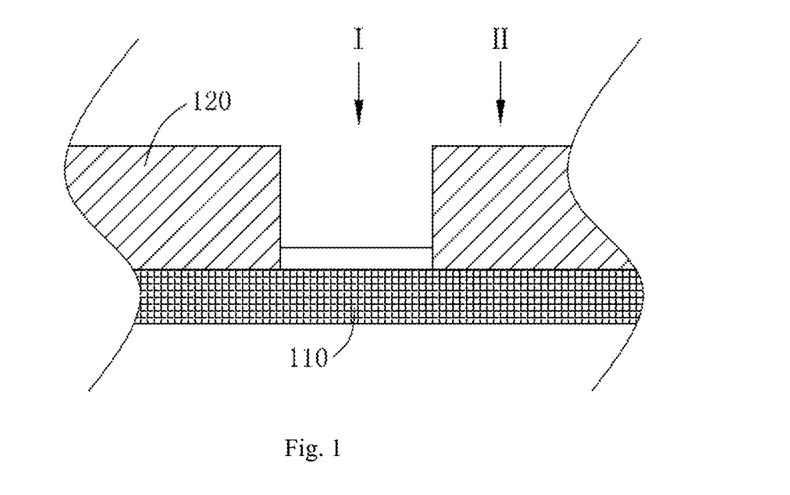
FIG. 1 is a partially structural diagram of a display substrate motherboard provided by an embodiment of the present disclosure.

An embodiment of the present disclosure provides a manufacturing method of a display substrate motherboard including a plurality of display units 120 located on an organic substrate 110 and a cutting region I between adjacent display units 120, the cutting region including therein the organic substrate 110 and an inorganic film layer covering the organic substrate 110.

In the embodiment of the present disclosure, before cutting the cutting region of the display substrate motherboard using laser, an inorganic film layer is provided on the organic substrate. The inorganic film layer covers the organic substrate to avoid the damage of the display substrate due to particles formed by the carbonization of the organic substrate during the laser cutting process, thus improving the yield of the display substrate obtained by cutting the display substrate motherboard. Therefore, the technical solution provided by the present disclosure can improve the yield of the display substrate obtained by cutting the display substrate motherboard.

The above display substrate motherboard may be a flexible display substrate motherboard or a rigid display substrate motherboard. When the display substrate motherboard is a flexible display substrate motherboard, the organic substrate uses a flexible base substrate, such as a polyimide film; when the display substrate motherboard is a rigid display substrate motherboard, the organic substrate uses a rigid base substrate.

The display substrate motherboard includes an organic substrate 110 and a plurality of functional film layers on the organic substrate. The plurality of functional film layers may be at least one of a blocking layer, a buffer layer, an anode, a light emitting layer, a gate insulation layer, and an interlayer insulation layer. Among them, some of the plurality of the functional film layers will only remain in the display region II during the manufacturing process, thereby forming the display units 120 in the display region II; portions of other film layers located in the cutting region I will be etched during the manufacturing process. In this way, the distance between the upper surface of thus obtained display substrate motherboard and the organic substrate 110 varies.

In the embodiment of the present disclosure, the manufacturing process of the inorganic film layer on the organic substrate 110 includes two stages of formation and etching. In the forming stage, the inorganic film layer is integrally formed, that is, formed in the display region II and the cutting region I at the same time; in the etching stage, the inorganic film layer in the cutting region I may be etched at least part of the thickness. It should be noted that each inorganic film layer located in the cutting region I may be etched once this inorganic film layer is formed; or after at least two inorganic film layers are formed, the at least two inorganic film layers located in the cutting region I are etched together using a single etching process.

The total thickness of the inorganic film layers in the cutting region I of the display substrate motherboard may be the thickness of any one of the inorganic film layers after it is thinned, or may be the sum of the thicknesses of multiple inorganic film layers after thinning.

A portion of the upper surface of the display substrate motherboard located in the display region II is farthest from the organic substrate, and a portion of the upper surface located in the cutting region I is closest to the organic substrate.

When cutting, the display substrate motherboard is cut by the laser along the laser cutting line, wherein the laser cutting line is located in the cutting region I.

Wherein, the total thickness of the inorganic film layers in the cutting region ranges from 200 to 400 nm.

If the thickness of the inorganic film layers in the cutting region is too large, the display substrate obtained after laser cutting is prone to cracks, reducing the yield of the display substrate; on the other hand, if the thickness of the inorganic film layers in the cutting region is too small, the effect of preventing the organic film layer from being carbonized to form particles during laser cutting is not good, which also reduces the yield of the display substrate.

In this embodiment, by designing the total thickness of the inorganic film layers in the cutting region to be in the range of 200 to 400 nm, it is possible to prevent the organic film layer from being carbonized to form particles during cutting and to ensure that the display substrate obtained by cutting is free from cracks, thereby improving the yield of the display substrate obtained by cutting the display substrate motherboard.

Figure 2:
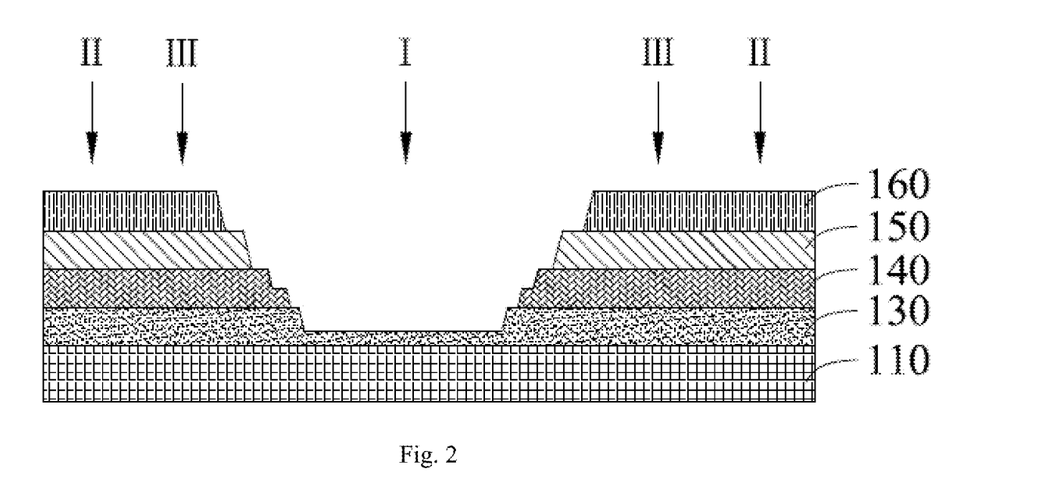
FIG. 2 is a structural diagram of an inorganic film layer of a display substrate motherboard in a cutting region provided by another embodiment of the present disclosure.
Figure 3:
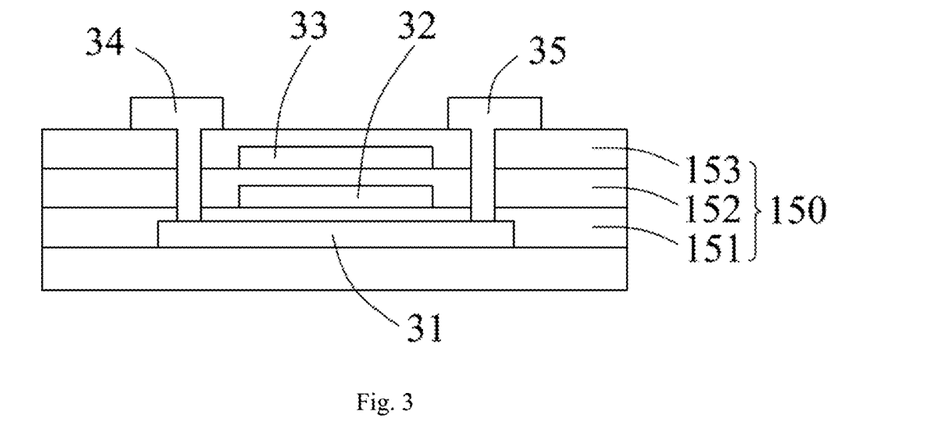
FIG. 3 is a structural diagram of a thin film transistor array layer in a display substrate motherboard provided by another embodiment of the present disclosure.

Further, as shown in FIGS. 2 and 3, the display substrate motherboard further includes a bezel region III between the display unit and the cutting region I, and the inorganic film layer in the bezel region III includes a blocking layer 130 on the organic substrate 110, and the inorganic film layer in the cutting region I includes part of the blocking layer 130 located on the organic substrate 110.

The thickness of the part of the blocking layer 130 in the cutting region I is less than the thickness of the blocking layer 130 in the bezel region.

Wherein, the remaining inorganic film layer in the cutting region I except the blocking layer 130 may be removed. At this time, the thickness of the remaining blocking layer 130 in the cutting region I may be in the range of 200 to 400 nm.

The thickness of the part of the blocking layer 130 in the cutting region I may be removed by the etching process. At this time, the blocking layer 130 has a step shape at a boundary between the cutting region I and the bezel region III.

In an alternative embodiment, as shown in FIG. 2, the inorganic film layer in the bezel region III further includes a buffer layer 140, a first inorganic film layer 150 in a thin film transistor array layer, and a protection layer 160 located on the blocking layer sequentially.

In this embodiment, the thin film transistor may be a dual gate thin film transistor, and the thin film transistor array layer may be as shown in FIG. 3. In FIG. 3, the reference numeral 31 indicates an organic semiconductor active layer (P—Si), the reference numeral 32 indicated a first gate, the reference numeral 33 indicates a second gate, the reference numeral 34 indicates a source, and the reference numeral 35 indicates a drain, wherein the first inorganic film layer 150 may include a first gate insulation layer 151, a second gate insulation layer 152, and an interlayer insulation layer 153, the first gate insulation layer 151 is used to block the connection between the first gate 32 and the organic semiconductor active layer 31; the second gate insulation layer 152 is used to block the connection between the second gate 33 and the first gate 32; the interlayer insulation layer 153 is used to block the connections between the source 34, the drain 35 and the two gates.

As shown in FIG. 2, the bezel region III is located between the display region II and the cutting region I, and serves as a bezel in the display substrate formed by cutting the display substrate motherboard. In order to ensure the normal use of the display substrate, the thickness of the inorganic film layer in the bezel region is not reduced.

In this embodiment, the total thickness of the inorganic film layers in the cutting region I of the display substrate motherboard is the thickness after the blocking layer 130 is thinned.

When an inorganic film layer other than the blocking layer 130 is formed on the organic substrate 110, the inorganic film layer located in the cutting region I will be completely removed during the etching stage; when the blocking layer 130 is formed on the organic substrate 110, part of the thickness of the blocking layer 130 in the cutting region is removed during the etching stage, leaving a certain thickness.

In this embodiment, the remaining part of the blocking layer 130 can avoid the damage of the display substrate due to the particles formed by the carbonization of the organic substrate during the laser cutting process, thus improving the yield of the display substrate obtained by cutting the display substrate motherboard.

Wherein, the total thickness of the inorganic film layers in the bezel region may be in the range of 1700 to 2100 nm, and the thickness of the part of the blocking layer in the cutting region may be in the range of 200 to 400 nm.

Further, the orthographic projection region of the first inorganic film layer 150 in the bezel region on the organic substrate 110 is located within the orthographic projection region of the buffer layer 140 in the bezel region on the organic substrate 110.

During the manufacturing process of the display substrate, it will be etched at least once. Each etching may etch only one inorganic film layer, or at least two inorganic film layers. In this embodiment, the first inorganic film layer 150 and part of the buffer layer 140 are removed by one etching. Due to the different heights of the two layers, the area of the removed region of the first inorganic film layer 150 will be larger than the area of the removed region of the buffer layer 140 so that the orthographic projection region of the first inorganic film layer 150 remaining in the bezel region on the organic substrate 110 is located within the orthographic projection region of the buffer layer 140 remaining in the bezel region on the organic substrate 110.

Further, the orthographic projection region of the protective layer 160 in the bezel region on the organic substrate is located within the orthographic projection of the first inorganic film layer 150 in the bezel region on the organic substrate.

During the manufacturing process of the display substrate, it will be etched at least twice. In this embodiment, the first inorganic film layer 150 is removed by one etching, and the protection layer 160 is removed by another etching, wherein the etching boundary for etching the first inorganic film layer 150 is located within the boundary for etching the protection layer 160, that is, the area of the removed region of the protection layer 160 is larger than the area of the removed region of the first inorganic film layer 150, so that the orthographic projection region of the protection layer 160 remaining in the bezel region on the organic substrate 110 is located within the orthographic projection region of the first inorganic film layer 150 remaining in the bezel region on the organic substrate 110.

Figure 4:
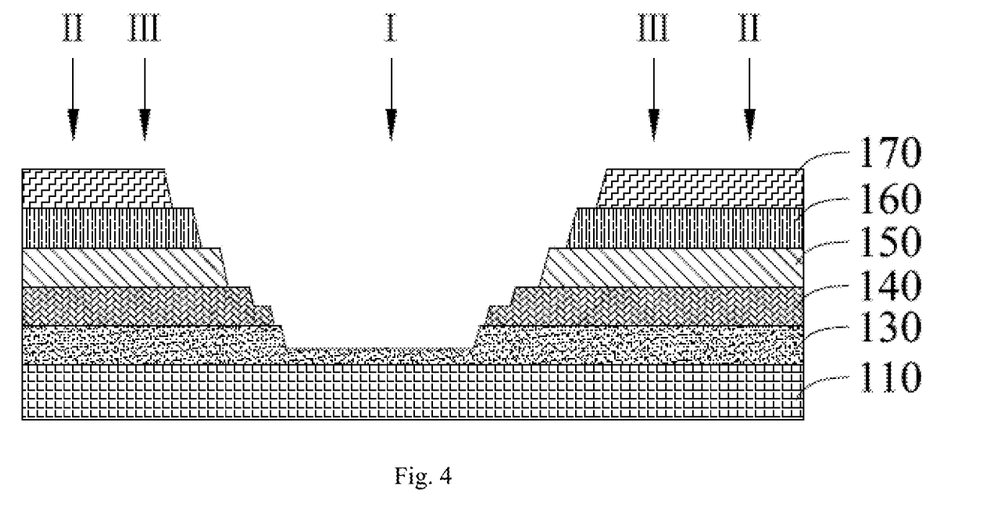
FIG. 4 is a structural diagram of an inorganic film layer of a display substrate motherboard in a cutting region provided by another embodiment of the present disclosure.

In an alternative embodiment, as shown in FIG. 4, the inorganic film layer in the bezel region III further includes a buffer layer 140, a first inorganic film layer 150 in the thin film transistor array layer, a protection layer 160 and a second inorganic film layer 170 in the touch control structure located on the blocking layer 130 sequentially. The inorganic film layer in the cutting region I includes part of the blocking layer 130 on the organic substrate 110.

Figure 5:
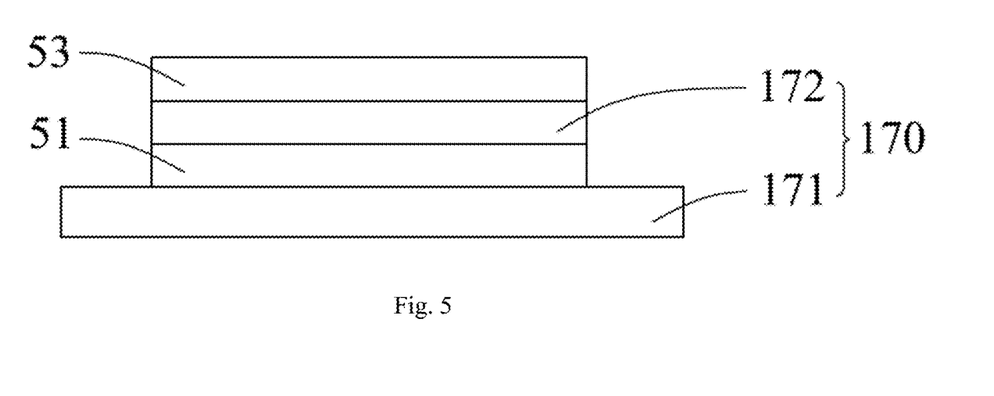
FIG. 5 is a structural diagram of s touch structure in a display substrate motherboard provided by another embodiment of the present disclosure.

In this embodiment, the touch structure may be as shown in FIG. 5. In FIG. 5, the reference numeral 51 indicates a touch driving electrode, the reference numeral 52 indicates a touch sensing electrode, wherein the second inorganic film layer 170 may include an inorganic material layer 171 and a touch insulation layer 172. The inorganic material layer 171 is used to provide a flat surface for the touch driving electrode 51; the touch insulation layer 172 is used to block the connection between the touch driving electrode 51 and the touch sensing electrode 52, thereby ensuring that the touch driving electrode and the touch sensing electrodes form a mutual capacitance structure.

In this embodiment, in the display substrate motherboard, a Flexible Multiple Layer On Cell (FMLOC) technique is applied to the protective layer 160 to form a touch structure.

In this embodiment, the total thickness of the inorganic film layers in the cutting region I of the display substrate motherboard is the thickness after the blocking layer 130 is thinned.

When an inorganic film layer other than the blocking layer 130 is formed on the organic substrate 110, the inorganic film layer located in the cutting region I will be completely removed during the etching stage; when the blocking layer 130 is formed on the organic substrate 110, part of the thickness of the blocking layer 130 in the cutting region is removed during the etching stage, leaving a certain thickness.

In this embodiment, the remaining part of the blocking layer 130 can avoid the damage of the display substrate due to the particles formed by the carbonization of the organic substrate during the laser cutting process, thus improving the yield of the display substrate obtained by cutting the display substrate motherboard.

Wherein, the total thickness of the inorganic film layers in the bezel region may be in the range of 2230 to 2630 nm, and the thickness of the part of the blocking layer in the cutting region may be in the range of 200 to 400 nm.

Further, the orthographic projection region of the second inorganic film layer in the bezel region on the organic substrate is located within the orthographic projection region of the protection layer in the bezel region on the organic substrate.

During the manufacturing process of the display substrate, it will be etched at least twice. In this embodiment, the second inorganic film layer 170 is removed by one etching, and the protection layer 160 is removed by another etching, wherein the etching boundary for etching the protection layer 160 is located within the boundary for etching the second inorganic film layer 170, that is, the area of the removed region of the second inorganic film layer 170 is larger than the area of the removed region of the protection layer 160, so that the orthographic projection region of the second inorganic film layer 170 remaining in the bezel region on the organic substrate 110 is located within the orthographic projection region of the protection layer 160 remaining in the bezel region on the organic substrate 110.

Further, the organic substrate 110 includes a first organic layer 111, a second organic layer 112, and an inorganic material layer 113 between the first organic layer 111 and the second organic layer 112, the second organic layer 112 is located between the plurality of display units and the first organic layer 111.

During the manufacturing process of the display substrate, the display substrate needs to be lifted off from the glass substrate by a laser lift-off (LLO) process, and the laser is likely to destroy the organic substrate of the display substrate during the lift-off process. In this embodiment, the organic substrate is designed to have a two-layer organic layer structure, ensuring that at least one organic layer in the display substrate after the lift-off process serves as the organic substrate, thereby improving the yield of the display substrate.

An embodiment of the present disclosure further provides a manufacturing method of a display substrate motherboard which includes:

forming a plurality of functional film layers on an organic substrate sequentially, wherein, forming an inorganic film layer among the plurality of functional film layers includes: removing at least part of a thickness of the inorganic film layer in a cutting region of the display substrate motherboard using an etching process, so that a total thickness of the inorganic film layer in the cutting region of the display substrate motherboard after a light emitting element and an encapsulation layer are formed ranges from 200 to 400 nm.

In the embodiment of the present disclosure, before cutting the cutting region of the display substrate motherboard using laser, an inorganic film layer is provided on the organic substrate. The inorganic film layer covers the organic substrate to avoid the damage of the display substrate due to particles formed by the carbonization of the organic substrate during the laser cutting process, thus improving the yield of the display substrate obtained by cutting the display substrate motherboard. Therefore, the technical solution provided by the present disclosure can improve the yield of the display substrate obtained by cutting the display substrate motherboard.

The above display substrate motherboard may be a flexible display substrate motherboard or a rigid display substrate motherboard. When the display substrate motherboard is a flexible display substrate motherboard, the organic substrate uses a flexible base substrate, such as a polyimide film; when the display substrate motherboard is a rigid display substrate motherboard, the organic substrate uses a rigid base substrate.

The display substrate motherboard includes an organic substrate and a plurality of functional film layers on the organic substrate. The plurality of functional film layers may be at least one of a blocking layer, a buffer layer, an anode, a light emitting layer, a gate insulation layer, and an inter-layer insulation layer. Among them, some of the plurality of the functional film layers will only remain in the display region II during the manufacturing process, thereby forming the display units 120 in the display region II; portions of other film layers located in the cutting region I will be etched during the manufacturing process. In this way, the distance between the upper surface of thus obtained display substrate motherboard and the organic substrate varies.

In the embodiment of the present disclosure, the manufacturing process of the inorganic film layer on the organic substrate includes two stages of formation and etching. In the forming stage, the inorganic film layer is integrally formed, that is, formed in the display region II and the cutting region I at the same time; in the etching stage, the inorganic film layer in the cutting region I may be etched at least part of the thickness. It should be noted that each inorganic film layer located in the cutting region I may be etched once this inorganic film layer is formed; or after at least two inorganic film layers are formed, the at least two inorganic film layers located in the cutting region I are etched together using a single etching process.

The total thickness of the inorganic film layers in the cutting region I of the display substrate motherboard may be the thickness of any one of the inorganic film layers after it is thinned, or may be the sum of the thicknesses of multiple inorganic film layers after thinning.

A portion of the upper surface of the display substrate motherboard located in the display region II is farthest from the organic substrate, and a portion of the upper surface located in the cutting region I is closest to the organic substrate.

When cutting, the display substrate motherboard is cut by the laser along the laser cutting line, wherein the laser cutting line is located in the cutting region I.

Wherein, the total thickness of the inorganic film layers in the cutting region ranges from 200 to 400 nm.

If the thickness of the inorganic film layers in the cutting region is too large, the display substrate obtained after laser cutting is prone to cracks, reducing the yield of the display substrate; on the other hand, if the thickness of the inorganic film layers in the cutting region is too small, the effect of preventing the organic film layer from being carbonized to form particles during laser cutting is not good, which also reduces the yield of the display substrate.

In this embodiment, by designing the total thickness of the inorganic film layers in the cutting region to be in the range of 200 to 400 nm, it is possible to prevent the organic film layer from being carbonized to form particles during cutting and to ensure that the display substrate obtained by cutting is free from cracks, thereby improving the yield of the display substrate obtained by cutting the display substrate motherboard.

Further, the step of forming the plurality of functional film layers on the organic substrate sequentially includes:

forming a blocking layer on the organic substrate;

removing at least part of a thickness of the blocking layer in the cutting region using an etching process.

In this embodiment, after thinning part of the thickness of the blocking layer in the cutting region I, the thickness of the remaining blocking layer in the cutting region I is smaller than the thickness of the blocking layer in the bezel region III.

Wherein, the remaining inorganic film layer in the cutting region I except the blocking layer may be removed. At this time, the thickness of the remaining blocking layer in the cutting region I may be in the range of 200 to 400 nm, as the only remaining inorganic film layer in the cutting region I.

After the etching is completed, the blocking layer has a step shape at a boundary between the cutting region I and the bezel region III.

Further, the step of forming the plurality of functional film layers on the organic substrate sequentially includes:

after at least two inorganic film layers are formed on the organic substrate, removing at least part of thicknesses of the at least two inorganic film layers in the cutting region using an etching process.

In this embodiment, after forming at least two inorganic film layers on the organic substrate, the at least two inorganic film layers located in the cutting region may be etched together using a single etching process, which can reduce the number of etching times for etching the inorganic film layers in the cutting region, improving the manufacturing efficiency of the display substrate motherboard.

Further, the step of forming the plurality of functional film layers on the organic substrate sequentially includes:

forming a blocking layer, a buffer layer and a thin film transistor array layer on the organic substrate sequentially;

removing a first inorganic film layer of the thin film transistor array layer and part of the buffer layer in the cutting region by a first etching;

removing the remaining buffer layer and part of the blocking layer in the cutting region by a second etching;

forming a protection layer on a side of the thin film transistor array layer facing away from the organic substrate, and removing the protection layer in the cutting region by a third etching so that a thickness of the remaining blocking layer in the cutting region of the display substrate motherboard ranges from 200 to 400 nm.

Figure 6:
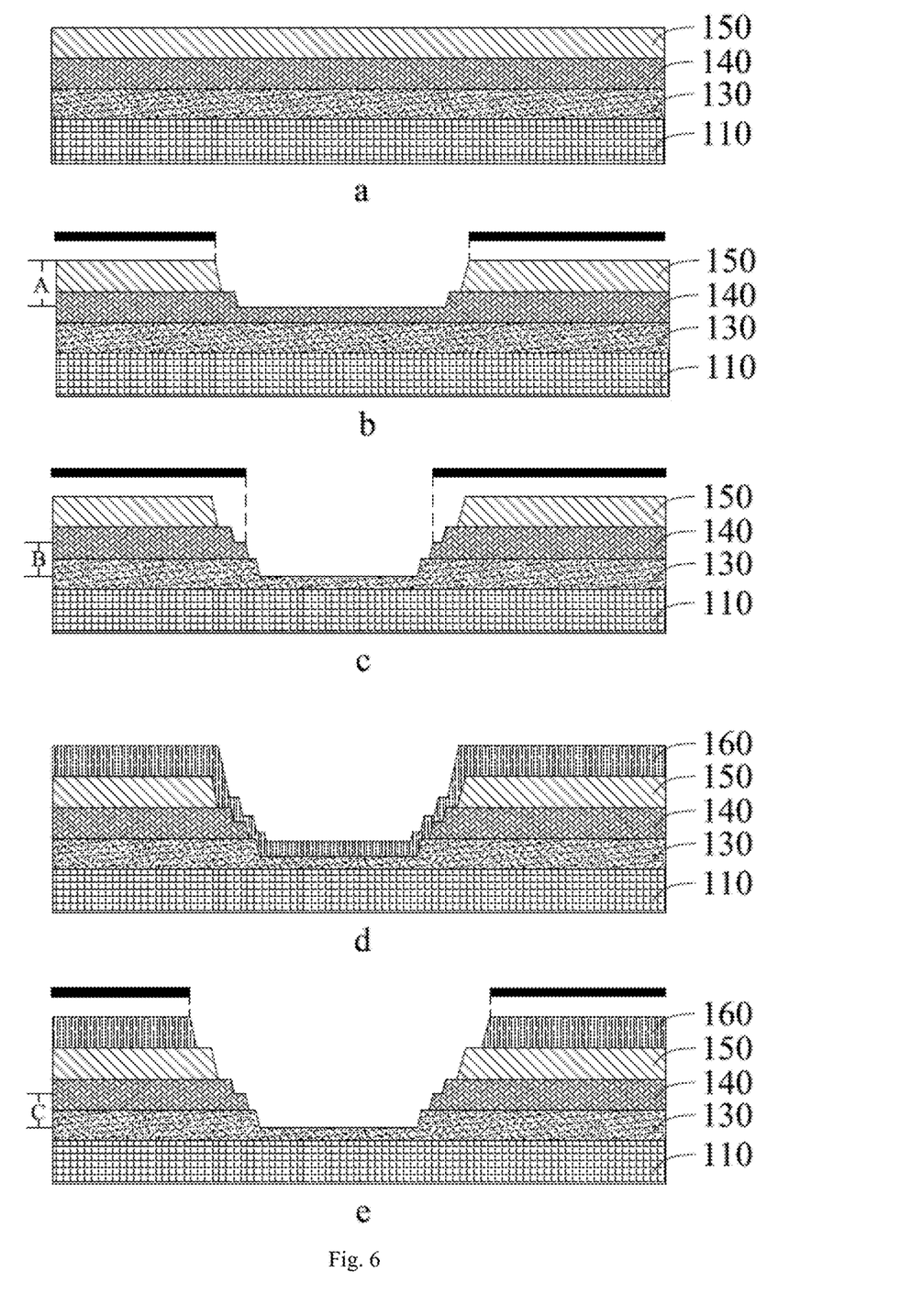
FIG. 6 is a schematic diagram of a manufacturing process of a display substrate motherboard provided by an embodiment of the present disclosure.

In this embodiment, as shown in FIG. 6, after the blocking layer 130, the buffer layer 140, and the first inorganic film layer 150 of the thin film transistor array layer are formed on the organic substrate 110, the structure of the inorganic film layers in the cutting region is as shown in a of FIG. 6. After removing the first inorganic film layer 150 of the thin film transistor array layer and part of the buffer layer 140 in the cutting region by a first etching (EBA), the structure of the inorganic film layers in the cutting region is as shown in b of FIG. 6. Specifically, after photoresist (not shown in the figure) is coated on the entire top surface of a in FIG. 6 and covered by a mask plate 1 (such as a black object above b in FIG. 6), the first inorganic film layer 150 of the thin film transistor array layer and part of the buffer layer 140 in the cutting region is removed by exposure and development. Next, the remaining buffer layer and part of the blocking layer in the cutting region are removed by a second etching (EBB) to obtain the layer structure as shown in c of FIG. 6. Specifically, after photoresist (not shown in the figure) is coated on the entire top surface of b in FIG. 6 and covered by a mask plate 2 (such as the black object above c in FIG. 6), the remaining buffer layer and part of the blocking layer in the cutting region is removed by exposure and development. After a protection layer is formed on the organic substrate, the structure of the inorganic film layers in the cutting region is as shown in d in FIG. 6. The protection layer in the cutting region is removed by a third etching (PVX) to obtain a layer structure as shown in e of FIG. 6, so that the thickness of the remaining blocking layer in the cutting region of the display substrate motherboard is in the range of 200 to 400 nm. Specifically, after photoresist (not shown in the figure) is coated on the entire top surface of d in FIG. 6 and covered by a mask plate 3 (such as the black object above e in FIG. 6), the protection layer in the cutting region is removed by exposure and development.

Wherein, the etching depth of the first etching (EBA) is A in FIG. 6; the etching depth of the second etching (EBB) is B in FIG. 6; and the etching depth of the third etching (PVX) is C in FIG. 6.

After the protection layer is formed, other inorganic film layers (for example, an encapsulation film layer) may be formed on the organic substrate. These inorganic film layers may be also removed by etching, leaving only the remaining blocking layer in the cutting region.

In this embodiment, by using multiple etchings to retain only a blocking layer with a thickness in the range of 200 to 400 nm in the cutting region of the display substrate motherboard using multiple etchings before cutting, it is possible to avoid the damage of the display substrate due to particles formed by the carbonization of the organic film layer during the laser cutting process, thereby improving the yield of the display substrate obtained by cutting the display substrate motherboard.

Further, the step of forming the plurality of functional film layers on the organic substrate sequentially includes:

forming a blocking layer, a buffer layer and a thin film transistor array layer on the organic substrate sequentially;

removing a first inorganic film layer of the thin film transistor array layer and part of the buffer layer in the cutting region by a first etching;

forming a protection layer on a side of the thin film transistor array layer facing away from the organic substrate, and removing the protection layer in the cutting region by a second etching;

forming a touch structure on a side of the protection layer facing away from the organic substrate, and removing a second inorganic film layer of the touch structure, the remaining buffer layer and part of the blocking layer in the cutting region, so that a thickness of the remaining blocking layer in the cutting region of the display substrate motherboard ranges from 200 to 400 nm.

Figure 7:
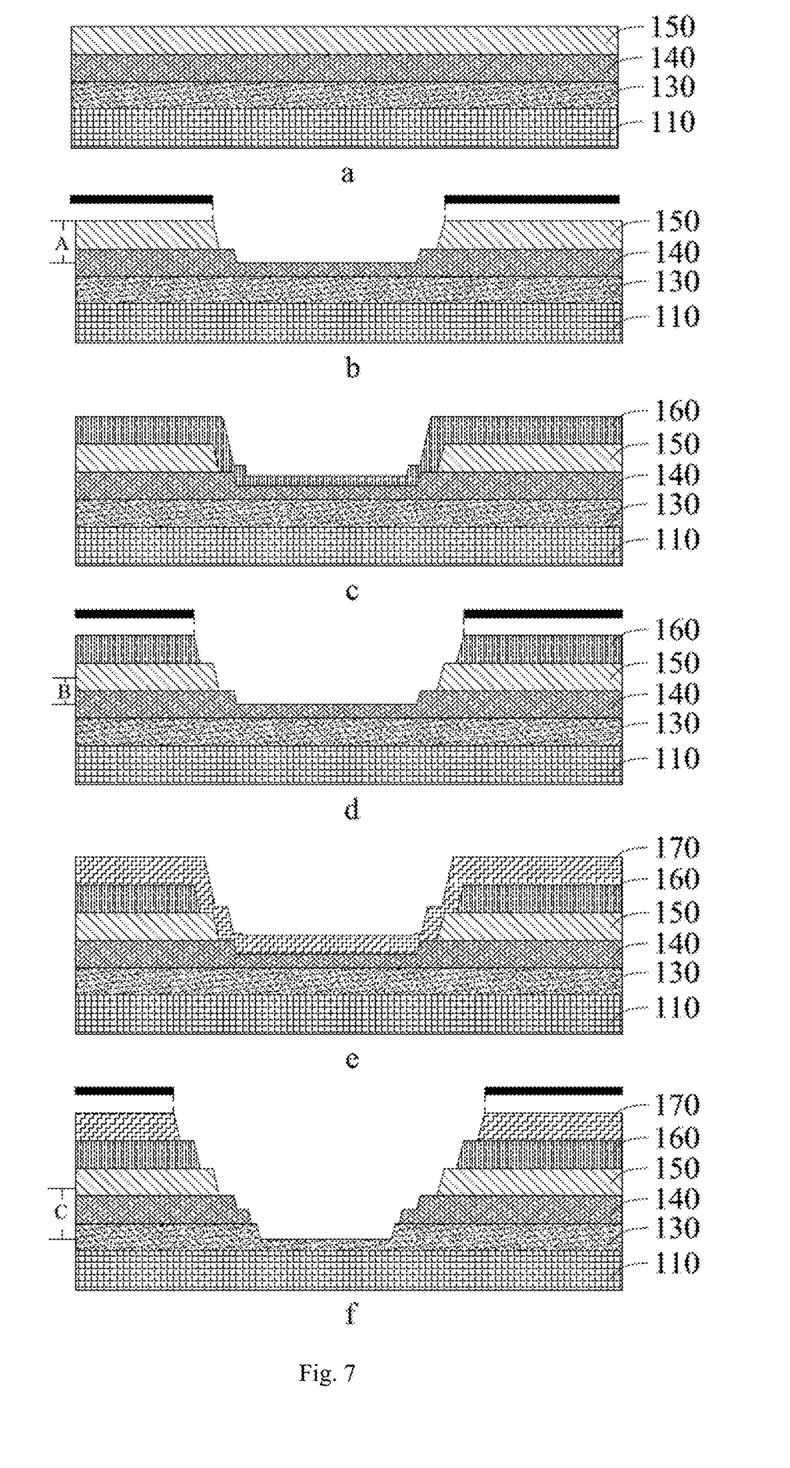
FIG. 7 is a schematic diagram of a manufacturing process of a display substrate motherboard provided by another embodiment of the present disclosure.

In this embodiment, as shown in FIG. 7, after the blocking layer 130, the buffer layer 140, and the first inorganic film layer 150 of the thin film transistor array layer are formed on the organic substrate 110, the structure of the inorganic film layers in the cutting region is as shown in a of FIG. 7. After removing the first inorganic film layer 150 of the thin film transistor array layer and part of the buffer layer 140 in the cutting region by a first etching (EBA), the structure of the inorganic film layers in the cutting region is as shown in b of FIG. 7. Specifically, after photoresist (not shown in the figure) is coated on the entire top surface of a in FIG. 7 and covered by a mask plate 4 (such as a black object above b in FIG. 7), the first inorganic film layer 150 of the thin film transistor array layer and part of the buffer layer 140 in the cutting region is removed by exposure and development. After the protection layer 160 is formed on the organic substrate 110, the structure of the inorganic film layers in the cutting region is as shown in c of FIG. 7. The protection layer in the cutting region is removed by a second etching (PVX), and at this time, the structure of the inorganic film layer in the cutting region is as shown in d of FIG. 7. Specifically, after photoresist (not shown in the figure) is coated on the entire top surface of c in FIG. 7 and covered by a mask plate 5 (such as the black object above d in FIG. 7), the protection layer in the cutting region is removed by exposure and development. After the touch structure is formed on a side of the protection layer facing away from the organic substrate 110, the structure of the inorganic film layers in the cutting region is as shown in e of FIG. 7. After the second inorganic film layer 170 of the touch structure, the remaining buffer layer 140 and part of the blocking layer 130 in the cutting region are removed by a third etching (TLD), the structure of the inorganic film layers in the cutting region is as shown in f of FIG. 7, so that the thickness of the remaining blocking layer in the cutting region of the display substrate motherboard is in the range of 200 to 400 nm. Specifically, after photoresist (not shown in the figure) is coated on the entire top surface of e in FIG. 7 and covered by a mask plate 6 (such as the black object above f in FIG. 7), the second inorganic film layer 170, the remaining buffer layer 140 and the part of the blocking layer 130 in the cutting region are removed by exposure and development.

Wherein, the etching depth of the first etching (EBA) is A in FIG. 7; the etching depth of the second etching (PVX) is B in FIG. 7; and the etching depth of the third etching (TLD) is C in FIG. 7.

It should be noted that, in order to ensure the connection between the touch structure and the conductive material in the display substrate in the third etching (TLD), the etched thickness will be greater than the thickness of the second inorganic film layer of the touch structure. Thus, in this embodiment, an additional etching step for removing the remaining buffer layer and part of the blocking layer can be omitted, and the manufacturing efficiency of the display substrate motherboard is improved.

After the protection layer is formed, other inorganic film layers (for example, an encapsulation film layer) may be formed on the organic substrate. These inorganic film layers may be also removed by etching, leaving only the remaining blocking layer in the cutting region.

In this embodiment, by using multiple etchings to retain only a blocking layer with a thickness in the range of 200 to 400 nm in the cutting region of the display substrate motherboard before cutting, it is possible to avoid the damage of the display substrate due to particles formed by the carbonization of the organic film layer during the laser cutting process, thereby improving the yield of the display substrate obtained by cutting the display substrate motherboard.

An embodiment of the present disclosure further provides a display device including the above display substrate.

The display device may be a display, a mobile phone, a tablet, a television, a wearable electronic device, a navigation display device, or the like.

Unless otherwise defined, the technical or scientific terms used in the present disclosure shall have the general meanings understood by those of ordinary skill in the art to which the present disclosure belongs. The terms "first", "second" and similar words used in the present disclosure do not indicate any order, quantity or importance, but are only used to distinguish different components. A word such as "comprising" or "including" and similar words mean that the elements or objects appearing before the word cover the elements or objects listed after the word and their equivalents, but do not exclude other elements or objects. "Connection" or "connected" and similar words are not limited to physical or mechanical connections, but may include electrical connections, whether direct or indirect. "Up", "down", "left", "right", etc., are only used to indicate the relative positional relationship. When the absolute position of the described object is changed, the relative positional relationship may also be changed accordingly.

It will be appreciated that, when an element such as a layer, film, region, or substrate is referred to as being "on" or "under" another element, it can be "directly" on the other element, or there may be an intermediate element.

The above are only optional implementations of the present disclosure. It should be noted that, without departing from the principles of the present disclosure, those of ordinary skill in the art can also make a number of improvements and modification, which should also be considered as the protection scope of the present disclosure.

What is claimed is:

1. A display substrate motherboard, comprising a plurality of display units located on an organic substrate and a cutting region between adjacent display units, the cutting region comprising therein the organic substrate and an inorganic film layer covering the organic substrate, wherein the display substrate motherboard further comprises a bezel region located between the display unit and the cutting region, an inorganic film layer in the bezel region comprises a blocking layer located on the organic substrate, the inorganic film layer in the cutting region comprises part of the blocking layer located on the organic substrate.

2. The display substrate motherboard according to claim 1, wherein a total thickness of the inorganic film layer in the cutting region ranges from 200 to 400 nm.

3. The display substrate motherboard according to claim 1, wherein a thickness of the part of the blocking layer in the cutting region is less than a thickness of the blocking layer in the bezel region.

4. The display substrate motherboard according to claim 3, wherein the thickness of the part of the blocking layer in the cutting region ranges from 200 to 400 nm.

5. The display substrate motherboard according to claim 1, wherein the blocking layer has a step shape at a boundary between the cutting region and the bezel region.

6. The display substrate motherboard according to claim 1, wherein the inorganic film layer in the bezel region further comprises a buffer layer, a first inorganic film layer in a thin film transistor array layer, and a protection layer located on the blocking layer sequentially.

7. The display substrate motherboard according to claim 6, wherein a total thickness of the inorganic film layer in the bezel region ranges from 1700 to 2100 nm, and a thickness of the part of the blocking layer in the cutting region ranges from 200 to 400 nm.

8. The display substrate motherboard according to claim 6, wherein an orthographic projection region of the first inorganic film layer in the bezel region on the organic substrate is located within an orthographic projection region of the buffer layer in the bezel region on the organic substrate.

9. The display substrate motherboard according to claim 6, wherein an orthographic projection region of the protection layer in the bezel region on the organic substrate is located within an orthographic projection region of the first inorganic film layer in the bezel region on the organic substrate.

10. The display substrate motherboard according to claim 1, wherein the inorganic film layer in the bezel region further comprises a buffer layer, a first inorganic film layer in a thin film transistor array layer, a protection layer and a second inorganic film layer in a touch structure located on the blocking layer sequentially.

11. The display substrate motherboard according to claim 10, wherein a total thickness of the inorganic film layer in the bezel region ranges from 2230 to 2630 nm, and a thickness of the part of the blocking layer in the cutting region ranges from 200 to 400 nm.

12. The display substrate motherboard according to claim 10, wherein an orthographic projection region of the second inorganic film layer in the bezel region on the organic substrate is located within an orthographic projection region of the protection layer in the bezel region on the organic substrate.

13. The display substrate motherboard according to claim 1, wherein the organic substrate comprises a first organic layer, a second organic layer, and an inorganic material layer located between the first organic layer and the second organic layer, the second organic layer is located between the plurality of display units and the first organic layer.

14. A display device comprising a display substrate formed by cutting the display substrate motherboard according to claim 1.

15. A method of manufacturing a display substrate motherboard, comprising:
forming a plurality of functional film layers on an organic substrate sequentially, wherein, forming an inorganic film layer among the plurality of functional film layers comprises: removing at least part of a thickness of the inorganic film layer in a cutting region of the display substrate motherboard using an etching process, so that a total thickness of the inorganic film layer in the cutting region of the display substrate motherboard after a light emitting element and an encapsulation layer are formed ranges from 200 to 400 nm.

16. The method according to claim 15, wherein the step of forming the plurality of functional film layers on the organic substrate sequentially comprises:
forming a blocking layer on the organic substrate;
removing at least part of a thickness of the blocking layer in the cutting region using an etching process.

17. The method according to claim 15, wherein the step of forming the plurality of functional film layers on the organic substrate sequentially comprises:
after at least two inorganic film layers are formed on the organic substrate, removing at least part of thicknesses of the at least two inorganic film layers in the cutting region using an etching process.

18. The method according to claim 17, wherein the step of forming the plurality of functional film layers on the organic substrate sequentially comprises:
forming a blocking layer, a buffer layer and a thin film transistor array layer on the organic substrate sequentially;
removing a first inorganic film layer of the thin film transistor array layer and part of the buffer layer in the cutting region by a first etching;
removing the remaining buffer layer and part of the blocking layer in the cutting region by a second etching;
forming a protection layer on a side of the thin film transistor array layer facing away from the organic substrate, and removing the protection layer in the cutting region by a third etching so that a thickness of the remaining blocking layer in the cutting region of the display substrate motherboard ranges from 200 to 400 nm.

19. The method according to claim 17, wherein the step of forming the plurality of functional film layers on the organic substrate sequentially comprises:
forming a blocking layer, a buffer layer and a thin film transistor array layer on the organic substrate sequentially;
removing a first inorganic film layer of the thin film transistor array layer and part of the buffer layer in the cutting region by a first etching;
forming a protection layer on a side of the thin film transistor array layer facing away from the organic substrate, and removing the protection layer in the cutting region by a second etching;
forming a touch structure on a side of the protection layer facing away from the organic substrate, and removing a second inorganic film layer of the touch structure, the remaining buffer layer and part of the blocking layer in the cutting region, so that a thickness of the remaining blocking layer in the cutting region of the display substrate motherboard ranges from 200 to 400 nm.

* * * * *